United States Patent [19]

Hayashi

[11] Patent Number: 5,298,279

[45] Date of Patent: Mar. 29, 1994

[54] METHOD FOR CONNECTING TERMINALS OF HEAT SEAL FILM SUBSTRATE

[75] Inventor: Tokumi Hayashi, Yamatokoriyama, Japan

[73] Assignee: Sharp Kabushiki Kaisha, Osaka, Japan

[21] Appl. No.: 975,712

[22] Filed: Nov. 13, 1992

[30] Foreign Application Priority Data

Nov. 14, 1991 [JP] Japan .................... 3-326971

[51] Int. Cl.$^5$ .................................. B05D 1/00
[52] U.S. Cl. ..................... 427/96; 427/261; 427/265; 427/370; 427/412.5
[58] Field of Search ............ 427/96, 261, 265, 370, 427/412.5

[56] References Cited

U.S. PATENT DOCUMENTS

| | | | |
|---|---|---|---|
| 4,269,680 | 5/1981 | Rowe | 522/110 |
| 4,626,961 | 12/1986 | Ono | 361/398 |
| 4,814,040 | 3/1989 | Ozawa | 427/96 |
| 5,019,944 | 5/1991 | Ishii | 361/400 |
| 5,038,251 | 8/1991 | Sugiyama | 361/398 |
| 5,049,085 | 9/1991 | Reylek | 439/591 |

FOREIGN PATENT DOCUMENTS 55-69186 5/1980 Japan .

Primary Examiner—Shrive Beck
Assistant Examiner—Vi Duong Dang
Attorney, Agent, or Firm—Birch, Stewart, Kolasch & Birch

[57] ABSTRACT

A hot melt agent is printed between terminals of a heat seal film substrate 1 having a circuit printed of conductive material on a base film such as polyester. An anisotropic film mixing nickel particles is printed on the terminals. Afterwards, a hot melt agent is printed on the upper surface, and thermo-compression bonded to the printed wiring board on the opposite side. Hence, deviation of terminals is prevented at the time of connection of heat seal film substrate connected by thermo-compression bonding, while elongation of base film is prevented, so that terminals may be connected accurately, so as to be applicable to fine pitches.

4 Claims, 2 Drawing Sheets

METHOD FOR CONNECTING TERMINALS OF HEAT SEAL FILM SUBSTRATE

BACKGROUND OF THE INVENTION

1. Field of the Invention

The present invention relates to a method for connecting terminals of heat seal film substrate used when connecting fine pitch terminals in liquid crystal display device or the like.

2. Description of the Related Art

In a terminal connecting method a method called carbon hot melt for printing a carbon hot melt agent on a terminal of a circuit made of a conductive material is formed on a base film, and thermo-compression bonding, and a method called ANISO type for printing an anisotropic film mixing nickel particles directly on a heat seal film, and thermo-compression bonding are known. In the connection of heat seal film substrate by such methods, however, when the pitches are made fine so as to be applicable to the latest liquid crystal display devices, fluctuations are likely to occur in the contact resistance value or insulation resistance value, and adverse effects may be caused on the functions of the products applied, and accordingly, hitherto, the heat seal film substrate used in liquid crystal display device or the like was of so-called MONOSO type as shown in FIG. 1, in which an anisotropic film 5 mixing nickel particles 5a is printed only on terminals 3 of the circuit printed of a conductive material of silver carbon on a base film 2 of polyimide or polyester, and then a hot melt agent 6 is printed on the surface, and thermo-compression bonded. FIG. 2 is a sectional view showing the state of the terminals 3 on the heat seal film substrate 1 connected to a conductive pattern 9 formed on an insulator 8 of a printed wiring board 7.

In the connection of heat seal film substrate of such conventional MONOSO type, the terminals of the heat seal film substrate side have a height of about 20 μm, and the conductor pattern of the printed wiring board side to which the terminals are connected is about 50 μm high, and therefore the terminals may slip in between the conductor patterns at the time of bonding, and the base film may be elongated by bonding temperature (about 180° C.), and position deviation may occur to make imperfect the connection between the terminals and conductor patterns.

SUMMARY OF THE INVENTION

It is hence a primary object of the invention to present a method for connecting terminals of heat seal film substrate capable of connecting the terminals securely to conductor patterns, without causing position deviation of the terminals of the heat seal film substrate on the conductor patterns of a printed wiring board, and without causing the terminals to slip in between the conductor patterns.

To accomplish the above object, the invention provides a method for connecting terminals of heat seal substrate comprising steps of, a method for connecting terminals of heat seal film substrate comprising steps of, printing a hot melt agent between terminals of a heat seal film substrate having a circuit printed of a conductive material on a base film of polyester or the like, printing an anisotropic film mixing nickel particles on the terminals, and thermo-compression bonding by printing a hot melt agent on their upper surfaces.

In a preferred embodiment, the method for connecting terminals of heat seal film substrate, wherein the hot melt agent is a hot melt adhesive mainly composed of phenol chloroprene resin.

In a further preferred embodiment of the method for connecting terminals of heat seal film substrate, wherein the hot melt agent between the terminals is selected in the length of 4 mm, width of 0.12 mm, and thickness of 10 to 20 μm, supposing the pitch of the terminals to be 0.3 mm.

In still another preferred embodiment the method for connecting terminals of heat seal film substrate, wherein the hot melt agent between the terminals is selected in the thickness of 10 to 20 μm, regardless of the intervals of the terminals.

According to the invention, the hot melt agent printed between terminals of the heat seal film substrate fills up the grooves between terminals and prevents the terminals of the opposite side from fitting in between the terminals, and also prevents uneven elongation of the base film due to heat.

Thus, according to the invention, since the hot melt agent is preliminarily printed between the terminals of the circuit printed on a base film and the upper surface is made flat, deviation of position or elongation of the base film at the time of bonding may be presented, so that the terminals may be connected securely. As a result, increasing the number of terminals connected, the pitches may be made fine, and an outstanding effect is brought about to the enhancement of the product yield.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENT

Figure 1:
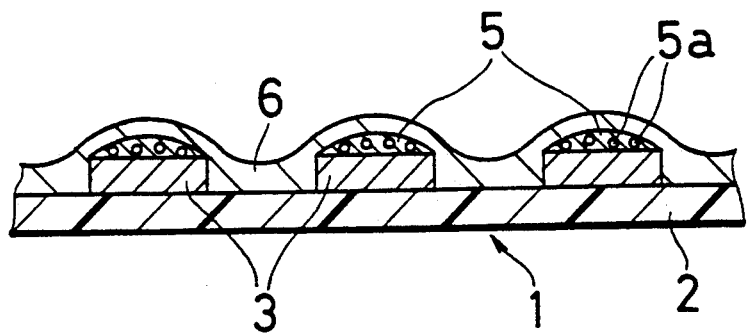
FIG. 1 is a sectional view showing the state before connection of heat seal film substrate in a prior art.
Figure 2:
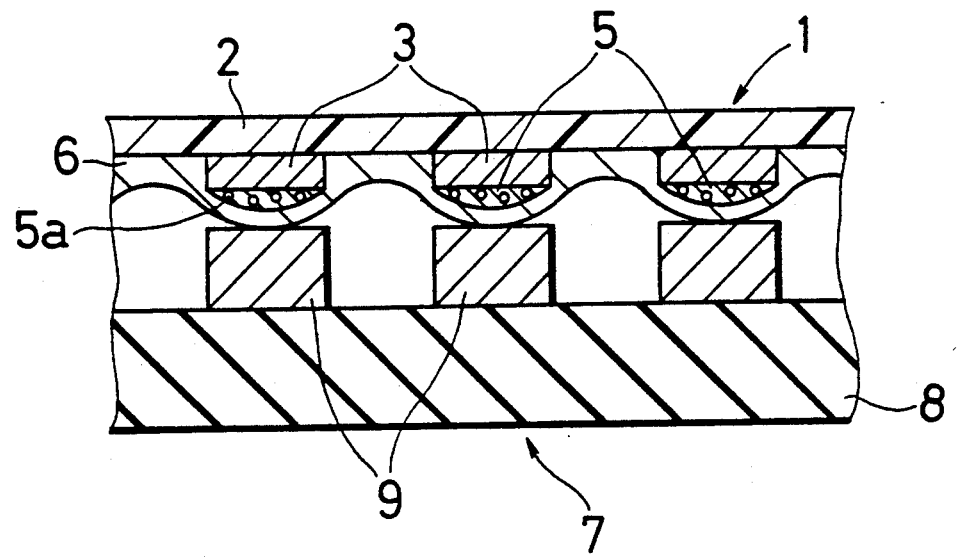
FIG. 2 is a sectional view showing the connection state of heat seal film substrate in the prior art.

Now referring to the drawing, preferred embodiments of the invention are described below.

Figure 3:
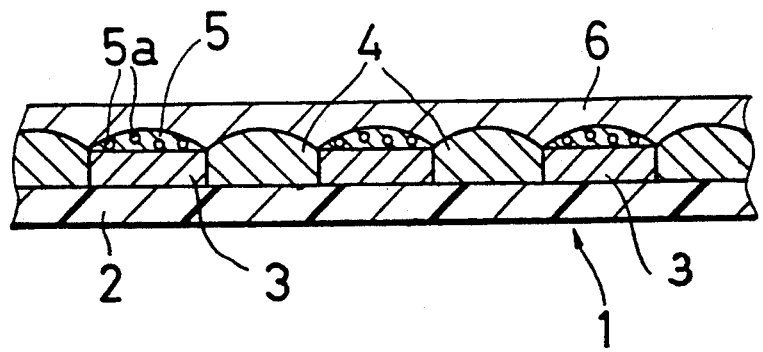
FIG. 3 is a sectional view showing the state before connection of heat seal film substrate in an embodiment of the invention.
Figure 4:
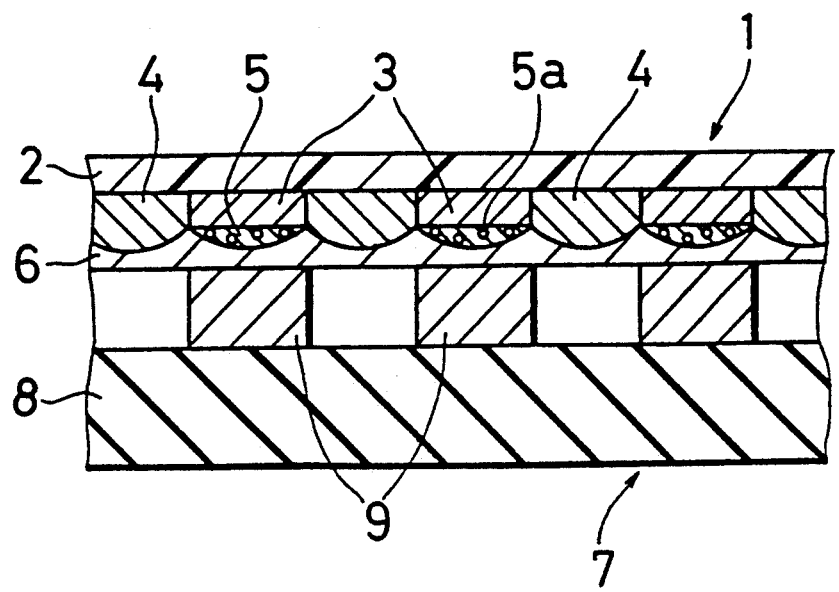
FIG. 4 is a sectional view showing the connection state of heat seal film substrate shown in FIG. 3.

FIG. 3 is a sectional view of a heat seal film substrate showing the state before bonding in an embodiment of the invention, and FIG. 4 is a sectional view showing the state bonded with a printed wiring board. As shown in the drawings, a heat seal film substrate 1 used in the invention is composed, same as in the prior art, by printing a circuit made of conductive material of silver carbon on a base film 2 made of polyimide or polyester in a thickness of about 25 μm.

In this embodiment, first an anisotropic film 5 mixing nickel particles 5a are formed on terminals 3 of a circuit printed on the heat seal film substrate 1, and a dummy hot melt agent 4 is printed between terminals 3, 3 to make the upper surface almost i.e. substantially flat, and a hot melt agent 6 for bonding is again printed on the upper surface, and the terminals 3 are set opposite to a conductive pattern 9 of the printed wiring board 7 to be connected, and compression bonded by heating. As a result, the anisotropic film 5 having a thermoplastic property and the hot melt agent 6 are melted, and the terminals 3 and the conductor pattern 9 are electrically connected by the nickel particles 5a mixed in the anisotropic film 5. At this time, in the method of the invention, the hot melt agent 4 is printed between the terminals 3, and the surface 4 is formed almost i.e. substantially flat, and therefore the terminals 3 will not slip in between the conductor patterns 9, of the printed wiring board 7, and moreover elongation of the base film 2 due to excessive force is avoided, and the mutually confronting terminals 3 and conductor patterns 9 are connected accurately.

The hot melt agents 4, 6 are hot melt adhesives mainly composed of phenol chloroprene resin. As for the printing quantity of the hot melt agent 6, for example, when forming at a pitch of 0.3 mm, the width is set at 0.12 mm, the length 4 mm, and the thickness 10 to 20 mm. The thickness may be uniform regardless of the pitch.

According to the invention, in the case of 0.3 mm pitch, the incidence rate of faulty connections is confirmed to be 0% in the invention, as compared with 30% in the prior art, by the present inventor.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method for connecting terminals formed on a heat seal film substrate comprising the steps of:
   printing an anisotropic film mixing nickel particles on the terminals,
   printing a first layer of hot melt agent comprising an adhesive resin between terminals of a heat seal film substrate having a circuit printed of a conductive material on a base film of polyester and forming a substantially flat upper surface thereat; and
   thermo-compression bonding by printing a second layer of hot melt agent comprising an adhesive resin on said substantially flat upper surface.

2. The method for connecting terminals of heat seal film substrate of claim 1, wherein the hot melt agent is a hot melt adhesive mainly composed of phenol chloroprene resin.

3. The method for connecting terminals of heat seal film substrate of claim 1, wherein a pitch of the terminals is substantially 0.3 mm and the hot melt agent between the terminals is selected in the length of 4 mm, width of 0.12 mm, and thickness of 10 to 20 $\mu$m.

4. The method for connecting terminals of heat seal film substrate of claim 1, wherein the terminals have spacing intervals and the hot melt agent between the terminals is selected in the thickness of 10 to 20 $\mu$m.

* * * * *